United States Patent
Lee et al.

(10) Patent No.: US 8,704,237 B2
(45) Date of Patent: Apr. 22, 2014

(54) ORGANIC LIGHT-EMITTING DISPLAY DEVICE AND METHOD OF MANUFACTURING THE SAME

(75) Inventors: Hae-yeon Lee, Yongin (KR); Jin-Gon Oh, Yongin (KR); Jae-Beom Choi, Yongin (KR); June-Woo Lee, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 165 days.

(21) Appl. No.: 13/353,372

(22) Filed: Jan. 19, 2012

(65) Prior Publication Data

US 2013/0037818 A1 Feb. 14, 2013

(30) Foreign Application Priority Data

Aug. 10, 2011 (KR) .......................... 10-2011-0079716

(51) Int. Cl.
*H01L 27/14* (2006.01)
*H01L 29/04* (2006.01)
*H01L 29/15* (2006.01)
*H01L 31/036* (2006.01)

(52) U.S. Cl.
USPC .................. 257/72; 438/34; 257/E33.053

(58) Field of Classification Search
None
See application file for complete search history.

(56) References Cited

U.S. PATENT DOCUMENTS

2007/0090421 A1   4/2007   Jung
2009/0278131 A1*  11/2009  Kwon et al. .................... 257/72

FOREIGN PATENT DOCUMENTS

| KR | 10-2001-0107088 A | 12/2001 |
| KR | 10-2004-0062195 A | 7/2004 |
| KR | 10-2006-0060257 A | 6/2006 |
| KR | 10-2007-0038193 A | 4/2007 |
| KR | 10-2007-0043070   | 4/2007 |

* cited by examiner

*Primary Examiner* — Sonya D McCall Shepard
(74) *Attorney, Agent, or Firm* — Lee & Morse, P.C.

(57) ABSTRACT

An organic light-emitting display device includes a thin film transistor including an active layer, a gate electrode, source/drain electrodes, a first insulating layer between the active layer and the gate electrode, and a second insulating layer over the gate electrode; a pixel electrode on the first insulating layer and the second insulating layer and connected to the source or drain electrode; a first wire on the first insulating layer, of the same material as the gate electrode; a second wire on the second insulating layer to at least partially overlap the first wire and including a lower wiring layer of the same material as the pixel electrode and an upper wiring layer on the lower wiring layer, of the same material as the source/drain electrodes; and third insulating layers between the second insulating layer and the pixel electrode and between the second insulating layer and the second wire.

27 Claims, 7 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims the benefit of Korean Patent Application No. 10-2011-0079716, filed on Aug. 10, 2011, in the Korean Intellectual Property Office, the disclosure of which is incorporated herein in its entirety by reference.

BACKGROUND

1. Field

Embodiments relate to an organic light-emitting display device and a method of manufacturing the same, and more particularly, to an organic light-emitting display device for reducing parasitic capacitance of a wiring region, and a method of manufacturing the same.

2. Description of the Related Art

A flat panel display device, such as an organic light-emitting display device or a liquid crystal display device, includes a thin film transistor (TFT), a capacitor, and wires connecting the TFT and capacitor.

The flat panel display device is manufactured by forming minute patterns of the TFT, capacitor, and wires on the substrate, wherein the minute patterns are formed on the substrate mostly by using a photolithography process for transferring the minute patterns by using a mask.

SUMMARY

According to an aspect, there is provided an organic light-emitting display device including a thin film transistor disposed on a substrate and including an active layer, a gate electrode, source and drain electrodes, a first insulating layer interposed between the active layer and the gate electrode, and a second insulating layer interposed between the source and drain electrodes, and the gate electrode; a pixel electrode disposed on the second insulating layer; a first wire disposed on the first insulating layer and formed of a same material as the gate electrode; a second wire disposed on the second insulating layer to at least partially overlap with the first wire, the second wire including a lower wiring layer formed of a same material as the pixel electrode and an upper wiring layer disposed on the lower wiring layer and formed of a same material as the source and drain electrodes; third insulating layers disposed between the second insulating layer and the pixel electrode and between the second insulating layer and the second wire; a fourth insulating layer covering the source and drain electrodes and the upper electrode, and exposing the pixel electrode; an intermediate layer disposed on the pixel electrode and including an organic light-emitting layer; and a counter electrode disposed on the intermediate layer.

The first insulating layer may be commonly disposed on the active layer and below the first wire.

The pixel electrode and the third insulating layer may have a same etching surface.

The second wire and the third insulating layer may have a same etching surface.

The third insulating layer may include a material having a different etch rate from the second insulating layer.

The third insulating layer may include at least one of $SiN_x$, $SiO_2$, $ZrO_2$, $TiO_2$, $Ta_2O_5$, and $Al_2O_3$.

The material of the source electrode, the drain electrode, and the upper wiring layer may have a different etch rate from the pixel electrode and the lower wiring layer.

The pixel electrode may be electrically connected to one of the source and drain electrodes through one connector disposed above the pixel electrode.

The organic light-emitting display device may further include a capacitor that includes: a lower electrode disposed on the same layer as the gate electrode; and an upper electrode including a lower conductive layer formed of the same material as the pixel electrode and an upper conductive layer disposed on the lower conductive layer and formed of the same material as the source and drain electrodes, wherein the third insulating layer is also directly disposed between the lower electrode and the upper electrode.

The first insulating layer may be commonly disposed on the active layer and below the lower electrode.

The second insulating layer may not be disposed between the upper electrode and the lower electrode.

The upper electrode and the third insulating layer may have a same etching surface.

A thickness of the third insulating layer may be less than a thickness of the second insulating layer.

A dielectric constant of the third insulating layer may be higher than a dielectric constant of the first insulating layer.

The first wire may be a scan wire electrically connected to the gate electrode, and the second wire may be a data wire electrically connected to one of the source and drain electrodes.

The first wire may be a power supply wire electrically connected to the lower electrode, and the second wire may be a data wire electrically connected to one of the source and drain electrodes.

The first wire may be a scan wire electrically connected to the gate electrode, and the second wire may be a power supply wire electrically connected to the upper electrode.

The pixel electrode may be a light transmission electrode and the counter electrode may be a light reflection electrode.

The pixel electrode and the lower wiring layer of the second wire may include a transparent conducting oxide (TCO), wherein the TCO includes at least one of indium tin oxide (ITO), indium zinc oxide (IZO), zinc oxide (ZnO), indium oxide ($In_2O_3$), indium gallium oxide (IGO), and aluminum zinc oxide (AZO).

The pixel electrode may be a light reflection electrode and the counter electrode may be a light transmission electrode.

The pixel electrode and the lower wiring layer of the second wire may include a semi-transmission metal layer and a transparent conducting oxide (TCO), wherein the semi-transmission metal layer includes at least one selected from the group consisting of silver (Ag), aluminum (Al), and an alloy thereof.

According to another aspect, there is provided a method of manufacturing an organic light-emitting display device, the method including: performing a first mask process by forming a semiconductor layer on a substrate and forming an active layer of a thin film transistor by patterning the semiconductor layer; performing a second mask process by forming a first insulating layer, stacking a first conductive layer on the first insulating layer, and forming a first wire and a gate electrode of the TFT by patterning the first conductive layer; performing a third mask process by forming a second insulating layer and holes in the second insulating layer to partially expose source and drain regions of the active layer and forming an upper electrode; performing a fourth mask process by sequentially forming an insulating layer and a second conductive layer on the resultant structure of the third mask process, and forming a third insulating layer, and a pixel electrode and a lower wiring layer of a second wire at least partially overlapping with the first wire by simultaneously patterning the insulating layer and the second conductive layer; performing a fifth mask process by forming a third conductive layer on the resultant structure of the fourth mask process, and forming a source electrode, a drain electrode, and an upper wiring layer of the second wire by patterning the third conductive layer; and performing a sixth mask process by forming a fourth insulating layer and removing at least a part of the fourth insulating layer to partially expose the pixel electrode.

The method may further include, after the performing of the second mask process, doping the source and drain regions with an ion impurity.

The performing of the fourth mask process may include etching the third insulating layer; and etching the second conductive layer.

The third insulating layer may include a material having a different etch rate from the second insulating layer.

The performing of the fifth mask process may include forming the third conductive layer with a material having a different etch rate from the second conductive layer.

The performing of the second mask process may also include forming a lower electrode of a capacitor by patterning the first conductive layer, the performing of the fourth mask process includes forming a dielectric layer directly disposed on the lower electrode and a lower conductive layer of the upper electrode by simultaneously patterning the insulating layer and the second conductive layer, and the performing of the fifth mask process includes forming an upper conductive layer of the upper electrode by patterning the third conductive layer.

The method may further include, after the performing of the sixth mask process, forming an intermediate layer including an organic light-emitting layer on the exposed pixel electrode, and forming a counter electrode facing the pixel electrode to cover the intermediate layer.

BRIEF DESCRIPTION OF THE DRAWINGS

The above and other features will become more apparent by describing in detail exemplary embodiments thereof with reference to the attached drawings in which.

DETAILED DESCRIPTION

Figure 1:
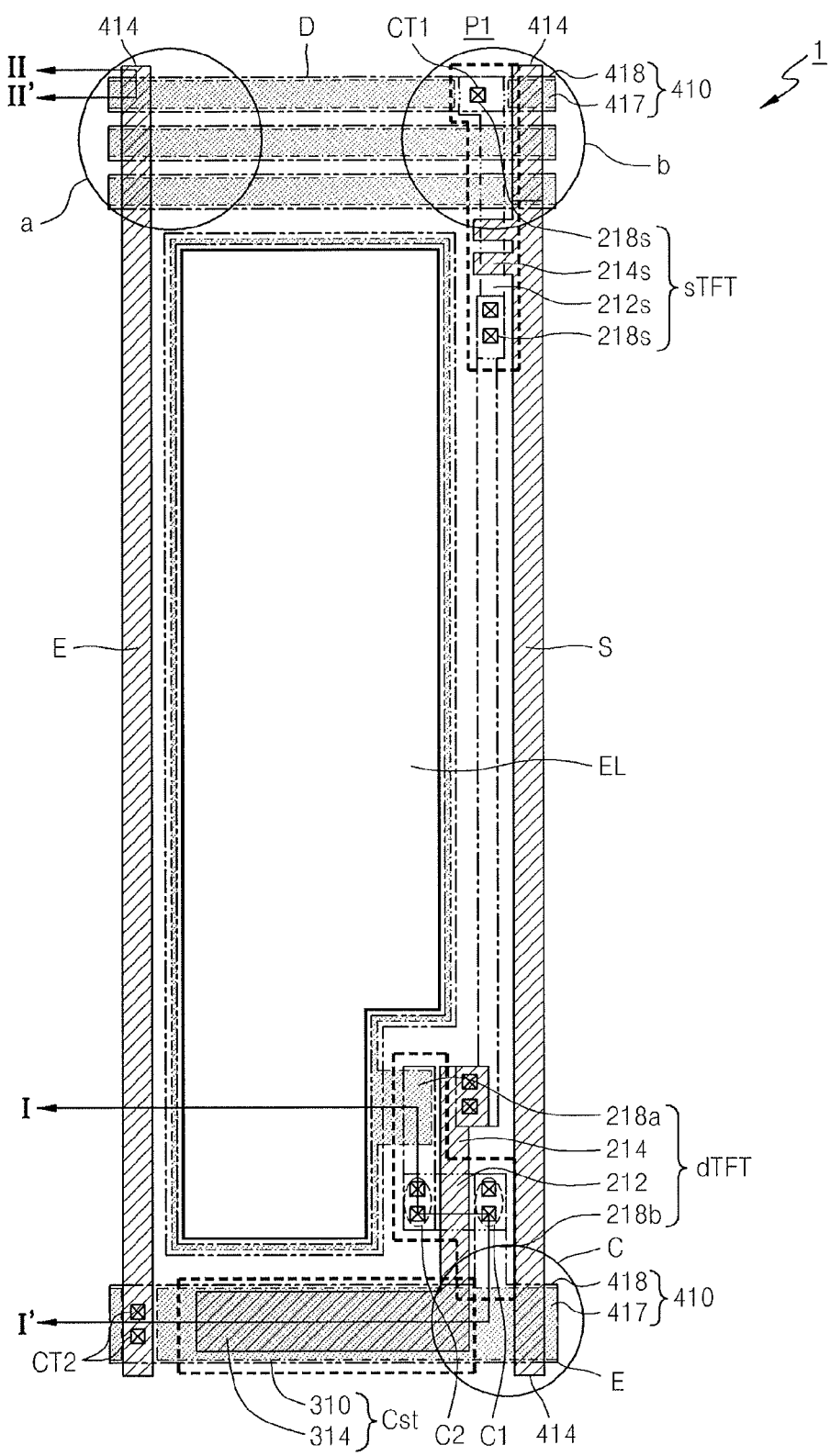
FIG. 1 is a plan view schematically illustrating an organic light-emitting display device according to an embodiment.

As various changes and numerous embodiments may be allowed, exemplary embodiments will be illustrated in the drawings and described in detail in the written description. However, is the exemplary embodiments are not intended to be limited to particular modes of practice, and it is to be appreciated that all changes, equivalents, and substitutes that do not depart from the spirit and technical scope are encompassed herein. In the description herein, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe exemplary embodiments, and are not intended to be limiting. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Figure 2:
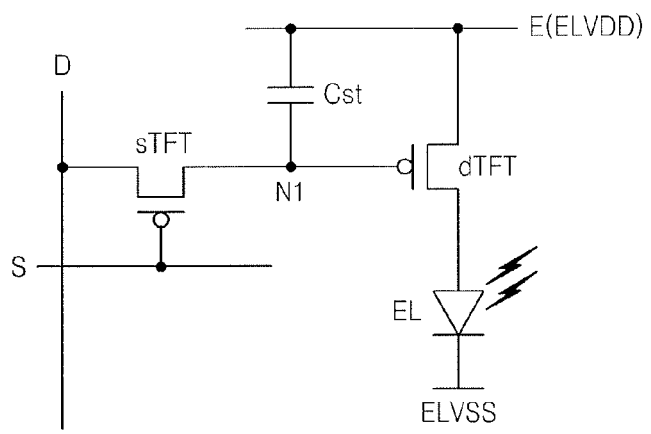
FIG. 2 is a circuit diagram of the organic light-emitting display device of FIG. 1.
Figure 3:
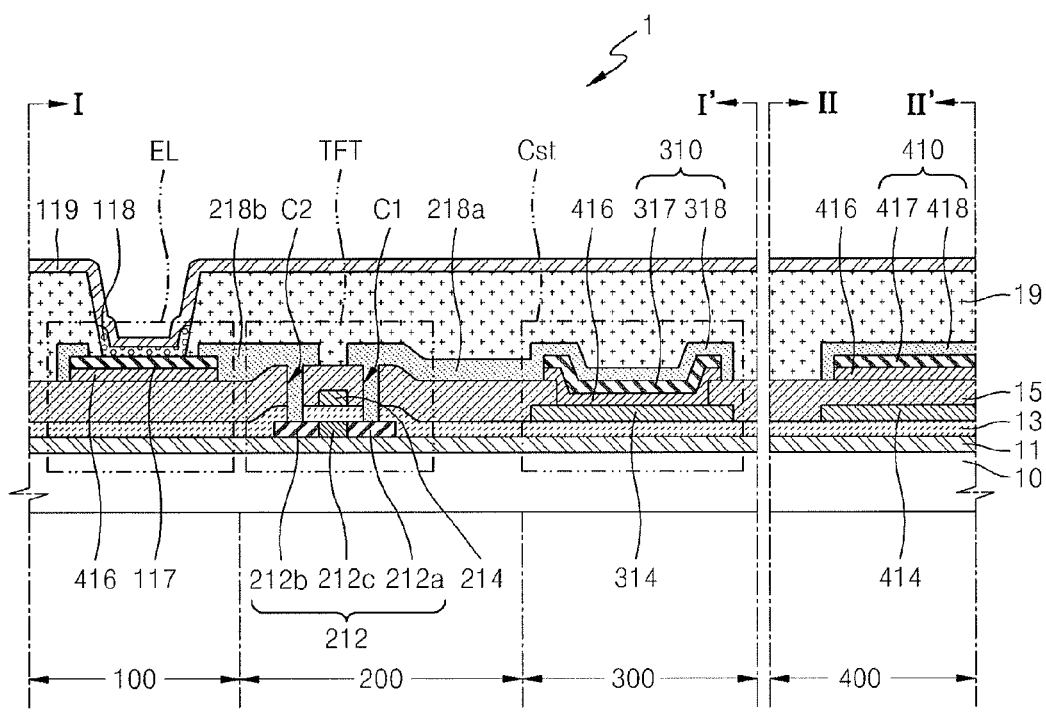
FIG. 3 is a cross-sectional view taken along lines I-I' and II-II' of FIG. 1.

FIG. 1 is a plan view schematically illustrating an organic light-emitting display device 1 according to an embodiment, FIG. 2 is a circuit diagram of the organic light-emitting display device 1 of FIG. 1, and FIG. 3 is a cross-sectional view taken along lines I-I' and II-II' of FIG. 1. Referring to FIG. 1, a pixel P1 included in the organic light-emitting display device 1 may include a plurality of wires, such as a scan wire S, a data wire D, and a power supply wire E, thin film transistors, such as a switching thin film transistor sTFT, and a driving thin film transistor dTFT, an organic light-emitting device EL, and a capacitor Cst.

FIG. 1 is only an example to describe the present embodiment, and the organic light-emitting display device 1 is not limited thereto. In other words, the organic light-emitting display device 1 may further include conductive lines other than the conductive lines shown in FIG. 1. Also, the number of thin film transistors and capacitors may vary. For example, at least three thin film transistors and at least two capacitors may be used according to a pixel circuit unit.

Referring to FIG. 2, a gate electrode of the switching thin film transistor sTFT may be electrically connected to the scan wire S, a first electrode of the switching thin film transistor sTFT may be electrically connected to the data wire D, and a second electrode of the switching thin film transistor sTFT may be connected to a first node N1. A gate electrode of the driving thin film transistor dTFT may be connected to the first node N1 to be electrically connected to the second electrode of the switching thin film transistor sTFT. The capacitor Cst may be connected between the power supply wire E and the first node N1. A first electrode of the driving thin film transistor dTFT may be connected to the power supply wire E to receive a first power supply voltage ELVDD. A second electrode of the driving thin film transistor dTFT may be connected to an anode of the organic light-emitting device EL. Also, a cathode of the organic light-emitting device EL receives a second power supply voltage ELVSS. In FIG. 2, the switching thin film transistor sTFT and the driving thin film transistor dTFT are P-type transistors. However, in other implementations, other types of the switching thin film transistor sTFT and the driving thin film transistor dTFT may be used. For example, at least one of the switching thin film transistor sTFT and the driving thin film transistor dTFT may be an N-type transistor. Also, since the switching thin film transistor sTFT and the driving thin film transistor dTFT are P-type transistors in FIG. 2, the first electrodes may be source electrodes and the second electrodes may be drain electrodes.

A method of driving the organic light-emitting display device 1 will now be described simply by referring to FIG. 2. First, when a scanning signal is supplied to the scan wire S, the switching thin film transistor sTFT is turned on and a data signal is transmitted to the first node N1. The data signal is applied to the capacitor Cst and the gate electrode of the driving thin film transistor dTFT. While the data signal is applied, a voltage level corresponding to the data signal is charged at the capacitor Cst. The driving thin film transistor dTFT generates a driving current according to a size of the data signal and outputs the driving current to the anode of the organic light-emitting device EL. The organic light-emitting device EL emits light having predetermined luminance according to the received driving current.

Referring to FIG. 3, a substrate 10 of the organic light-emitting display device 1 of FIG. 1 may include a light-emitting region 100 including at least one organic light-emitting device EL, a thin film transistor region 200 including at least one thin film transistor TFT, a storage region 300 including at least one capacitor Cst, and a wiring region 400 on which at least one line is disposed.

The thin film transistor region 200 may include at least one thin film transistor TFT such as a driving thin film transistor dTFT or a switching thin film transistor sTFT. The thin film transistor TFT may include an active layer 212, a gate electrode 214, and source and drain electrodes 218a and 218b. A first insulating layer 13 constituting a gate insulating layer may be disposed between the active layer 212 and the gate electrode 214. A second insulating layer 15 constituting an interlayer insulating layer may be disposed between the gate electrode 214 and the source and drain electrodes 218a and 218b. Source and drain regions 212a and 212b that are doped with high concentration impurities may be formed respectively at sides of the active layer 212, and are respectively electrically connected to the source and drain electrodes 218a and 218b via contact holes C1 and C2 through the first insulating layer 13 and the second insulating layer 15. For convenience of description, only the driving thin film transistor dTFT that is electrically connected and that supplies a current to the organic light-emitting device EL is shown in FIG. 3. However, the switching thin film transistor sTFT may have the same or similar structure as the driving thin film transistor dTFT.

The storage region 300 may include at least one capacitor Cst. The capacitor Cst charges a signal applied to the driving thin film transistor dTFT even after the switching thin film transistor sTFT is turned off. The capacitor Cst may include a lower electrode 314 and an upper electrode 310 as electrodes, and a third insulating layer 416 may be disposed between the lower and upper electrodes 314 and 310, as a dielectric layer. The lower electrode 314, which may be formed of the same material as the gate electrode 214, may be disposed on the first insulating layer 13. The upper electrode 310 may include a lower conductive layer 317 and an upper conductive layer 318, wherein the lower conductive layer 317 may be formed of the same material as a pixel electrode 117 to be described below, and the upper conductive layer 318 may be formed of the same material as the source and drain electrodes 218a and 218b. The second insulating layer 15 is not disposed between the lower electrode 314 and the upper electrode 310, and in an implementation, the third insulating layer 416 constituting a dielectric layer may be directly disposed between the lower electrode 314 and the upper electrode 310. As will be described below, a thickness of the third insulating layer 416 may be less than a thickness of the second insulating layer 15, and/or a dielectric constant of the third insulating layer 416 may be higher than a dielectric constant of the first insulating layer 13, thereby improving the electrostatic capacity of the capacitor Cst. Referring to FIG. 1, the upper electrode 310 may be electrically connected to the power supply wire E through contact holes CT2, and the lower electrode 314 may be electrically connected to the gate electrode 214, but other implementations are possible.

The light-emitting region 100 may include the organic light-emitting device EL. The organic light-emitting device EL may include the pixel electrode 117 electrically connected to one of the source and drain electrodes 218a and 218b of the thin film transistor TFT, a counter electrode 119 facing the pixel electrode 117, and an intermediate layer 118 disposed between the pixel electrode 117 and the counter electrode 119. The pixel electrode 117 may be disposed on a structure including the first insulating layer 13, the second insulating layer 15, and a third insulating layer 416, which may be sequentially disposed on the substrate 10. When the organic light-emitting display device 1 is a bottom emission type display device that emits light toward the substrate 10, the pixel electrode 117 may be a light transmission electrode and the counter electrode 119 may be a light reflection electrode. Alternatively, when the organic light-emitting display device 1 is a top emission type display device that emits light in a direction away from the substrate 10, the pixel electrode 117 may be a light reflection electrode including a semi-transmission metal layer, and the counter electrode 119 may be a light transmission electrode. In an implementation, the organic light-emitting display device 1 may be a dual emission type display device that emits light in bi-directions by combining the top and bottom emission type display devices.

The wiring region 400 may include at least one wire. Herein, the term "wire" is a generic term of a structure that transmits a current, a voltage, or a signal by electrically connecting the thin film transistor TFT, capacitor Cst, the organic light-emitting device EL, a driver integrated circuit (IC) (not shown), etc. included in the organic light-emitting display device 1. Accordingly, aside from the scan wire S, the data wire D, and the power supply wire E, the at least one wire may include various signal lines, such as a clock line and an initial signal input line, for transmitting a signal (such as CLK, CLKB, or SP) for driving various driver ICs. The wire may be disposed in a display region that includes a pixel array and displaying an image, or a non-display region that includes various pads for connection with an external IC. For example, wires disposed in the non-display region may be intensively disposed in a fan-out region between the display region and the pads. Such wires may be disposed on different layers according to a connection between a device and a driver IC.

According to an embodiment, parasitic capacitance generated between upper and lower wires at least partially overlapping and disposed on different layers may be reduced, and a short generated between the upper and lower wires may be reduced. Accordingly, a third insulating layer 416 constituting a wire insulating layer may be disposed between a second wire 410 constituting an upper wire and a first wire 414 constituting a lower wire.

Referring to FIG. 3, the first wire 414 may be disposed on a same first insulating layer 13 as the gate electrode 214 and the lower electrode 314. The second wire 410 may be disposed on the second insulating layer 15 and the third insulating layer 416 constituting the wire insulating layer. The second wire 410 may include a lower wiring layer 417 and an upper wiring layer 418, wherein the lower wiring layer 417 may be formed of the same material as the pixel electrode 117, and the upper wiring layer 418 may be formed of the same material as the source and drain electrodes 218a and 218b. The first and second wires 414 and 410 may at least partially overlap, and the third insulating layer 416 may reduce parasitic capacitance and a short that may be generated when the first and second wires 414 and 410 overlap.

Referring to a circle a of FIG. 1, the second wire 410 may be the data wire D and the first wire 414 may be the power supply wire E. The second wire 410 may extend in a row direction and the first wire 414 may extend in a column direction such that the second wire 410 and the first wire 414 at least partially overlap.

According to another embodiment, the second wire 410 may be the data wire D and the first wire 414 may be the scan wire S. Referring to a circle b of FIG. 1, the second wire 410 may be the data wire D electrically connected to a source or drain electrode 218s of the switching thin film transistor sTFT via a contact hole CT1, and the first wire 414 may be the scan wire S electrically connected to a gate electrode 214s of the switching thin film transistor sTFT. The data wire D and the scan wire S may extend in directions to cross each other at right angles. Accordingly, the data wire D and the scan wire S may at least partially overlap.

According to another embodiment, the second wire 410 may be the power supply wire E and the first wire 414 may be the scan wire S. Referring to a circle c of FIG. 1, the second wire 410 may be the power supply wire E electrically connected to the upper electrode 310 of the capacitor Cst, and the first wire 414 may be the scan wire S electrically connected to the gate electrode 214s of the switching thin film transistor sTFT. As shown in FIG. 1, the power supply wire E and the scan wire S may partially overlap.

The data wire D for transmitting a data signal, the scan wire S for transmitting a scanning signal, and the power supply wire E for transmitting the first power supply voltage ELVDD may exist as upper and lower wires on different layers, and thus may be arranged to at least partially overlap. Each wire may be formed of a conductive material, and an insulating layer may be disposed between the upper and lower wires. Accordingly, a parasitic capacitor that includes the upper and lower wires respectively as upper and lower electrodes, and an insulating layer disposed between the upper and lower wires as a dielectric layer may be formed. Parasitic capacitance of such a parasitic capacitor may generate a resistance and capacitance (RC) delay in an entire panel. The parasitic capacitance is determined according to Equation 1 below. Here, C denotes parasitic capacitance, c denotes a dielectric constant of an insulating layer, A denotes an area of overlapping wires, and d denotes a distance between upper and lower wires.

$$C = \varepsilon \frac{A}{d}$$ [Equation 1]

However, according to an embodiment, a wire insulating layer may be further disposed between an upper wire and a lower wire. Accordingly, a distance d between the upper and lower wires may be increased, and thus parasitic capacitance may be decreased. Accordingly, an RC delay of a panel may be decreased. Resistance may be decreased as the second wire 410 may include two wires, namely, the upper wiring layer 418 and the lower wiring layer 417. Accordingly, an IR drop may be improved.

Referring to FIGS. 1 and 3, the third insulating layer 416 may be formed in the same pattern as the pixel electrode 117, the lower conductive layer 317 and the lower wiring layer 417. Thus, the third insulating layer 416 is not formed in the contact hole CT1 where the second wire 410 and an active layer 212s of the switching thin film transistor sTFT contact each other, and in contact holes CT2 where the first wire 414 and the second wire 410 contact each other. Also, the second wire 410 constituting an upper wire in the contact holes CT1 and CT2 may have only the upper wiring layer 418, and may not have the lower wiring layer 417. As will be described below, electric connection is a key point in the contact holes CT1 and CT2. Accordingly, it is desirable that the third insulating layer 416 including an insulating material not be formed in the contact holes CT1 and CT2. The third insulating layer 416 may be formed simultaneously with the lower wiring layer 417 via one process, in order not to dispose the third insulating layer 416 in the contact holes CT1 and CT2. Accordingly, the lower wiring layer 417 may not be formed, and only the upper wiring layer 418 may be formed in the contact holes CT1 and CT2.

Hereinafter, a method of manufacturing the organic light-emitting display device 1 will be described with reference to FIGS. 4 through 9.

Figure 4:
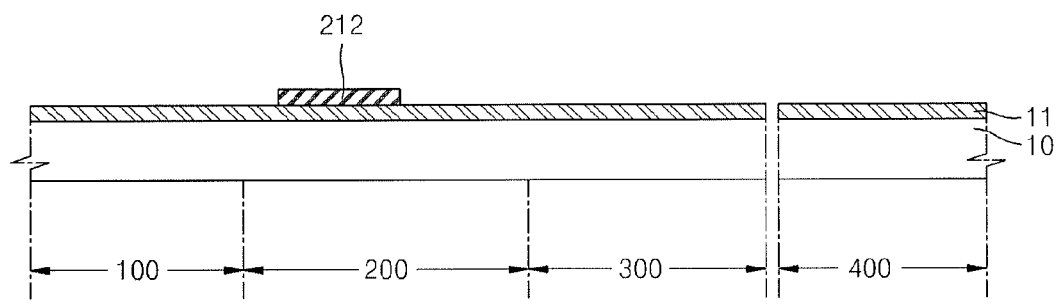
FIG. 4 is a cross-sectional view for describing a first mask process of the organic light-emitting display device of FIG. 1.

First, as shown in FIG. 4, an auxiliary layer 11 may be formed on the substrate 10.

The substrate 10 may be a transparent substrate, such as a glass substrate or a plastic substrate including polyethylene terephthalate (PET), polyethylene naphthalate (PEN), or polyimide.

The auxiliary layer 11, such as a barrier layer, a blocking layer, and/or a buffer layer, for preventing impurity ions from diffusing into the substrate 10, preventing moisture or external air from penetrating into the substrate 10, and planarizing a surface of the substrate 10 may be formed on the substrate 10. The auxiliary layer 11 may be a single layer or a plurality of layers formed of $SiO_2$ or SiNx, and may be formed by using a deposition method, such as a plasma-enhanced chemical vapor deposition (PECVD) method, an atmosphere pressure CVD (APCVD) method, or a low pressure CVD (LPCVD) method.

Next, the active layer 212 may be formed on the auxiliary layer 11 in the thin film transistor region 200. In detail, a polycrystalline silicon layer (not shown) may be formed by first depositing an amorphous silicon layer (not shown) on the auxiliary layer 11 and crystallizing the amorphous silicon layer. The amorphous silicon layer may be crystallized using any method, such as a rapid thermal annealing (RTA) method, a solid phase crystallization (SPC) method, an excimer laser annealing (ELA) method, a metal-induced crystallization (MIC) method, a metal-induced lateral crystallization (MILC) method, or a sequential lateral solidification (SLS) method. Then, the polycrystalline silicon layer may be patterned into the active layer 212 of the thin film transistor TFT by using a mask process using a first mask (not shown).

Figure 5A:
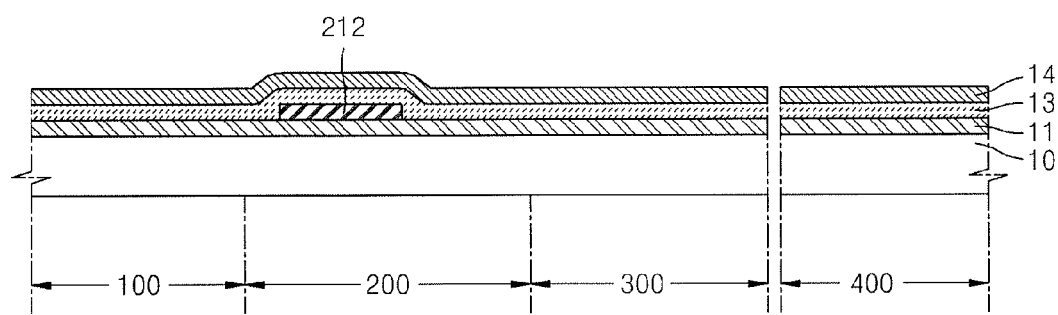
FIGS. 5A and 5B are cross-sectional views for describing a second mask process of the organic light-emitting display device of FIG. 1.

Then, as shown in FIG. 5A, the first insulating layer 13 and a first conductive layer 14 may be sequentially formed on an entire surface of the substrate 10 on which the active layer 212 may be formed.

The first insulating layer 13 may be deposited by using an inorganic insulating material, such as $SiO_x$, SiON, $Al_2O_3$, TiO$_2$, Ta$_2$O$_5$, HfO$_2$, ZrO$_2$, BST, or PZT, via a method, such as a PECVD method, an APCVD method, or an LPCVD method. The first insulating layer 13 may be formed of an organic insulating material, as an example. The first insulating layer 13 may operate as a gate insulating layer of the thin film transistor TFT, between the active layer 212 of the thin film transistor TFT and the gate electrode 214.

The first insulating layer 13 used as the gate insulating layer is not used as a dielectric layer of the capacitor Cst to be described below in the current embodiment. Accordingly, the first insulating layer 13 may be designed based on the characteristics of the gate insulating layer of the thin film transistor TFT without having to consider the dielectric constant characteristics of the capacitor Cst. For example, when silicon nitride (SiN$_x$), which is often used as a dielectric layer of the capacitor Cst, is simultaneously used as a gate insulating layer of the thin film transistor TFT in order to increase the electrostatic capacity of the capacitor Cst, a leakage current may be generated at the thin film transistor TFT. However, according to the current embodiment, the dielectric layer of the capacitor Cst and the gate insulating layer of the thin film transistor TFT may be separately formed. Accordingly, the dielectric layer and the gate insulating layer may be selected by only considering the characteristics of the capacitor Cst and thin film transistor TFT.

The first conductive layer 14 may be a single or multilayer structure formed of at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

Figure 5B:
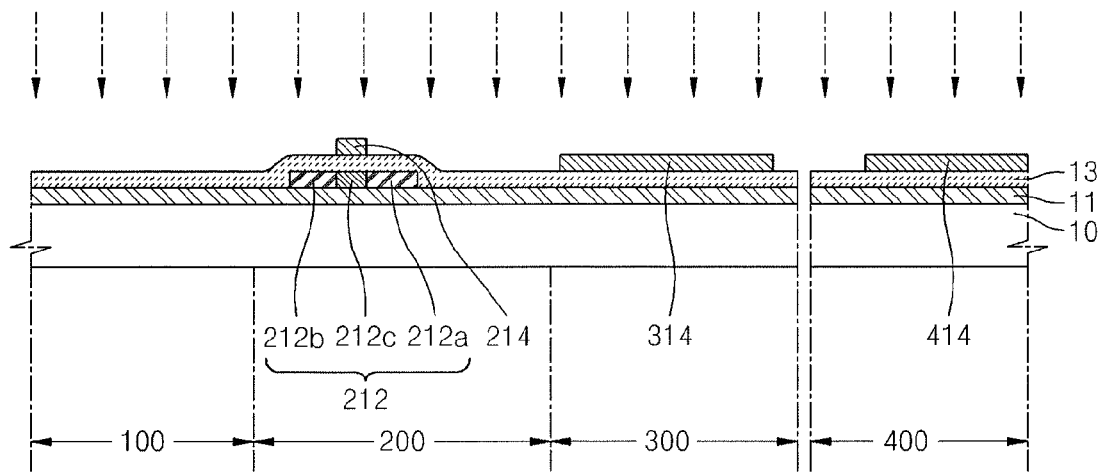

Next, as shown in FIG. 5B, the gate electrode 214 may be formed on the thin film transistor region 200, the lower electrode 314 may be formed on the storage region 300, and the first wire 414 may be formed on the wiring region 400.

In detail, the first conductive layer 14 formed on the entire surface of the substrate 10 may be patterned via a mask process using a second mask (not shown).

The lower electrode 314 may be formed in the storage region 300 and the first wire 414 may be formed in the wiring region 400, and as shown in FIG. 5B, the lower electrode 314 and the gate electrode 214 may be spaced apart from each other. In another implementation, the lower electrode 314 and the gate electrode 214 may be integrated, as shown in FIG. 1.

The gate electrode 214 may be formed to correspond to a center of the active layer 212. The source and drain regions 212$a$ and 212$b$ at sides of the active layer 212 corresponding to edges of the gate electrode 214 and a channel region 212$c$ between the source and drain regions 212$a$ and 212$b$ may be formed by doping n- or p-type impurities using the gate electrode 214 as a self-aligned mask. Here, the n- or p-type impurities may be boron (B) ions or phosphor (P) ions.

Figure 6:
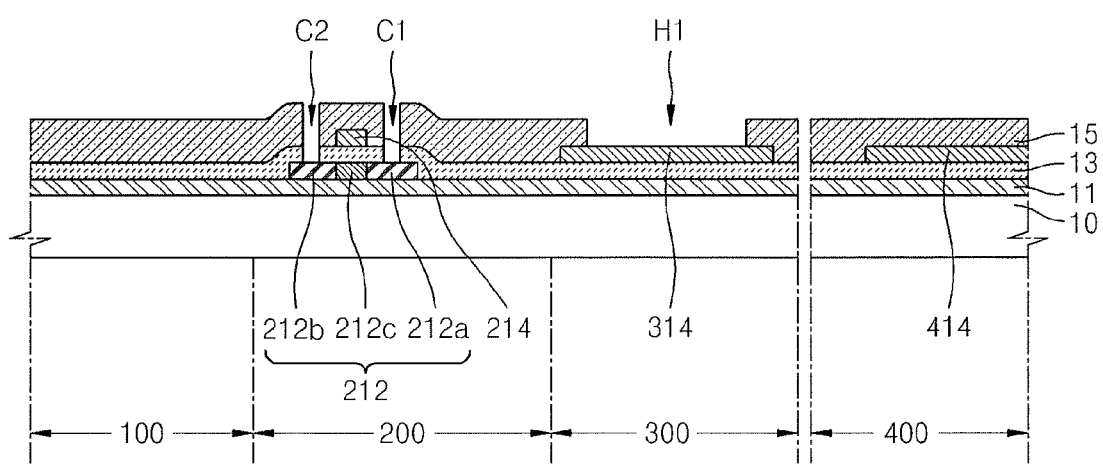
FIG. 6 is a cross-sectional view for describing a third mask process of the organic light-emitting display device of FIG. 1.

Next, as shown in FIG. 6, the second insulating layer 15 may be deposited on the resultant structure of FIG. 5B, and then the first insulating layer 13 and/or the second insulating layer 15 may be patterned to form the contact holes C1 and C2 and a first opening H1.

The second insulating layer 15 may be formed of an inorganic insulating material selected from SiO$_2$, SiN$_x$, SiON, Al$_2$O$_3$, TiO$_2$, Ta$_2$O$_5$, HfO$_2$, ZrO$_2$, BST, and PZT. The second insulating layer 15 may be formed of a material having a different refractive index from a material of the first insulating layer 13. A thickness of the second insulating layer 15 may be sufficient enough, for example, may be thicker than a thickness of the first insulating layer 13, to perform functions as an interlayer insulating layer between the gate electrode 214 and the source and drain electrodes 218$a$ and 218$b$. The second insulating layer 15 may be formed of not only the inorganic insulating material stated above, but also an organic insulating material, or may be formed by alternately stacking an organic insulating material and an inorganic insulating material.

In detail, the contact holes C1 and C2 and the first opening H1 may be formed by patterning the first insulating layer 13 and/or the second insulating layer 15 via a mask process using a third mask (not shown).

The contact holes C1 and C2 may be formed to expose a part of the source and drain regions 212$a$ and 212$b$ of the active layer 212. The opening H1 may be formed to partially expose the lower electrode 314 of the capacitor Cst.

According to an embodiment, the second insulating layer 15 is not disposed between the upper electrode 310 and the lower electrode 314 of the capacitor Cst due to the first opening H1. However, the second insulating layer 15 may be disposed as an interlayer insulating layer between the gate electrode 214 of the thin film transistor TFT and the source and drain electrodes 218$a$ and 218$b$. Here, the phrase "the second insulating layer 15 is not disposed between the upper electrode 310 and the lower electrode 314 of the capacitor Cst" may refer to the second insulating layer 15 not operating as a dielectric layer of the capacitor Cst. For example, as shown in FIG. 6, the second insulating layer 15 may be disposed to slightly overlap with edges of the lower electrode 314. Such an overlapping portion may be a remaining portion when forming the first opening H1 that exposes the lower electrode 314 by patterning the second insulating layer 15. If the entire lower electrode 314 of the capacitor Cst were to be exposed when patterning the second insulating layer 15, a leakage current may be generated between the lower electrode 314 and the upper electrode 310 formed on the third insulating layer 416. Accordingly, the second insulating layer 15 may partially cover the edge of the lower electrode 314 without exposing the entire lower electrode 314. Therefore, a leakage current between the upper electrode 310 and the lower electrode 314 may be prevented.

The second insulating layer 15 operating as an interlayer insulating layer of the thin film transistor TFT may have at least a predetermined thickness considering the characteristics of the thin film transistor TFT, but since the electrostatic capacity of the capacitor Cst decreases as a thickness of a dielectric layer increases, the electrostatic capacity may decrease if the dielectric layer has the same thickness as the interlayer insulating layer.

However, according to the current embodiment, the second insulating layer 15 is not used as a dielectric layer of the capacitor Cst and the third insulating layer 416 used as a dielectric layer as will be described below may have a thinner thickness than the second insulating layer 15. Accordingly, the electrostatic capacity may be prevented from being reduced.

Figure 7A:
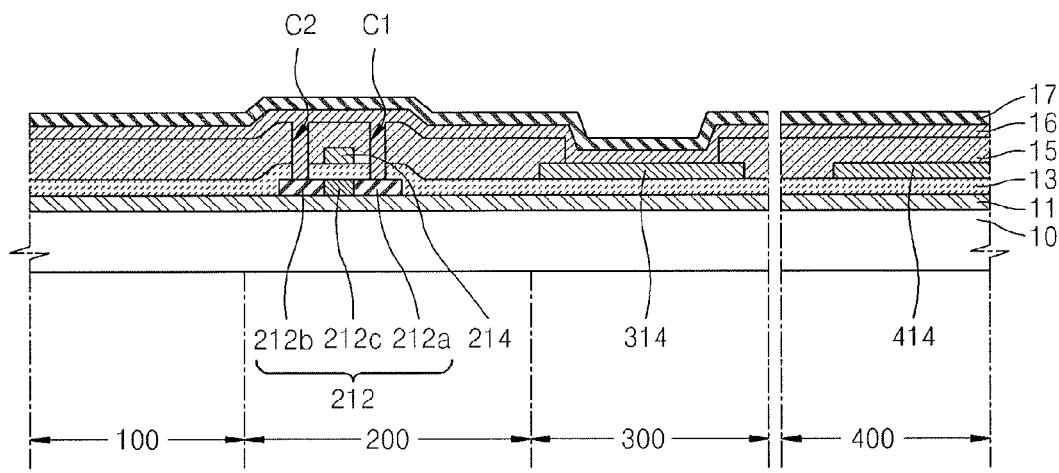
FIGS. 7A and 7B are cross-sectional views for describing a fourth mask process of the organic light-emitting display device of FIG. 1.
Figure 7B:
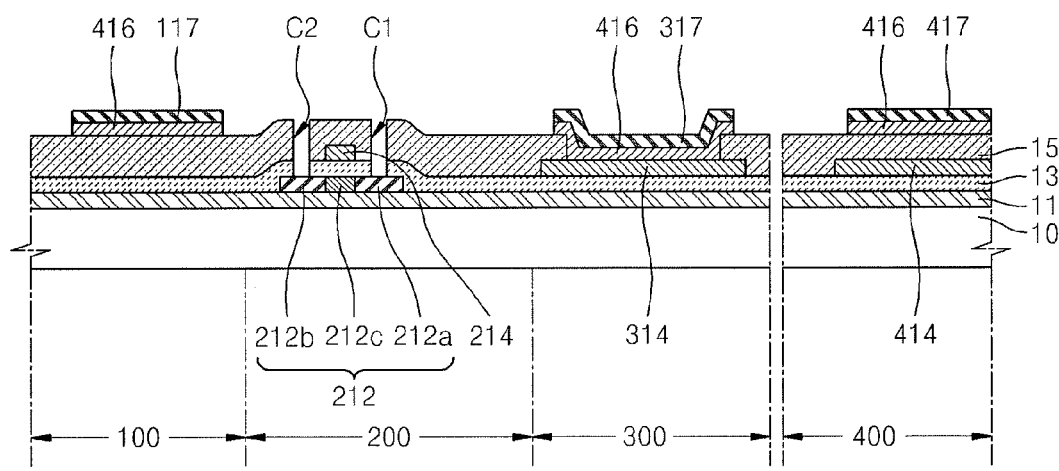

Next, as shown in FIGS. 7A and 7B, the pixel electrode 117 may be formed in the light-emitting region 100, the lower conductive layer 317 for forming the upper electrode 310 may be formed in the storage region 300, and the lower wiring layer 417 for forming the second wire 410 may be formed in the wiring region 400.

In detail, an insulating layer 16 and a second conductive layer 17 may be sequentially formed on a resultant structure of FIG. 6, as shown in FIG. 7A, and the insulating layer 16 and the second conductive layer 17 may be simultaneously patterned via a mask process using a fourth mask (not shown), as shown in FIG. 7B, to form the third insulating layers 416, and the pixel electrode 117, the lower conductive layer 317 and the lower wiring layer 417, respectively.

The insulating layer 16 may be formed of an inorganic insulating material selected from SiO$_2$, SiN$_x$, SiON, Al$_2$O$_3$, TiO$_2$, Ta$_2$O$_5$, HfO$_2$, ZrO$_2$, BST, and PZT, and may be formed of a material having a different refractive index from materials of the auxiliary layer 11, the first insulating layer 13, and the second insulating layer 15. Accordingly, insulating layers having different refractive indexes may be alternately stacked to operate as a distributed Bragg reflector (DBR), thereby increasing the light efficiency of light emitted from an organic light-emitting layer. The insulating layer 16 may be formed of an organic insulating material.

A thickness of the third insulating layer 416 used as a dielectric layer may be less than a thickness of the second insulating layer 15. Accordingly, the electrostatic capacity of the capacitor Cst is not decreased when the third insulating layer 416 operates as a dielectric layer of the capacitor Cst. For example, the thickness of the third insulating layer 416 may be from about 500 Å to about 2000 Å so that a suitable electrostatic capacity may be maintained.

The third insulating layer 416 used as a dielectric layer may be formed of an insulating material having a high dielectric constant. As described above, the third insulating layer 416 may be formed as a separate layer from the first insulating layer 13 forming a gate insulating layer. Accordingly, the electrostatic capacity may be increased by forming the third insulating layer 416 by using a material having a higher dielectric constant than the first insulating layer 13. The electrostatic capacity may be increased without having to increase an area of the capacitor Cst, and thus, an aperture ratio of the organic light-emitting display device 1 may be increased by relatively increasing an area of the pixel electrode 117.

The insulating layer 16 may be formed of a material having a different etch rate from the second insulating layer 15 so that the second insulating layer 15 is not damaged while patterning the insulating layer 16 when the second insulating layer 15 is also exposed to an etchant. The second insulating layer 15 is not etched while patterning the insulating layer 16. Accordingly, a distance between upper and lower wires may be maintained, and thus parasitic capacitance is not increased.

When the organic light-emitting display device 1 is a bottom emission type display device, the second conductive layer 17 may be formed of a transparent conducting oxide. For example, the second conductive layer 17 may be formed of a material selected from indium tin oxide (ITO), indium zinc oxide (IZO), zinc oxide (ZnO), indium oxide (In$_2$O$_3$), indium gallium oxide (IGO), and aluminum zinc oxide (AZO).

In another implementation, when the organic light-emitting display device 1 is a top emission type display device, the second conductive layer 17 may not only be formed of a transparent conducting oxide, but also may be formed as a plurality of layers by depositing a semi-transmission metal layer on a transparent conducting oxide layer. The semi-transmission metal layer may be formed of at least one material selected from silver (Ag), an Ag alloy, aluminum (Al), and an Al alloy.

According to the mask process using the fourth mask, the insulating layer 16 and the second conductive layer 17 of the light-emitting region 100 may be patterned into the third insulating layer 416 below the pixel electrode 117 and the pixel electrode 117. The insulating layer 16 and the second conductive layer 17 of the storage region 300 may be patterned into the third insulating layer 416 of the capacitor Cst and the lower conductive layer 317 of the upper electrode 310. Also, the insulating layer 16 and the second conductive layer 17 of the wiring region 400 may be patterned into the third insulating layer 416 and the lower wiring layer 417 of the second wire 410.

As described above, the insulating layer 16 and the second conductive layer 17 may be simultaneously patterned in the same mask process. Accordingly, it may not be possible to leave a part of or remove the third insulating layer and the second conductive layer. The insulating layer 16 and the second conductive layer 17 may be removed from locations corresponding to the contact holes C1 and C2 and CT1 and CT2 for electric connection, and only a third conductive layer that will be described below may be filled.

Although the insulating layer 16 and the second conductive layer 17 may be patterned during the same mask process, since the insulating layer 16 and the second conductive layer 17 may be formed of different materials, an etching process may be performed twice. In other words, the etching process may include a process of etching the insulating layer 16 and a process of etching the second conductive layer 17.

However, the insulating layer 16 and the second conductive layer 17 may be etched during the same mask process. Accordingly, etching surfaces of the insulating layer 16 and the second conductive layer 17, i.e., the third insulating layer 416 below the pixel electrode 117 and the pixel electrode 117 may be the same, etching surfaces of the third insulating layer 416 and the lower conductive layer 317 may be the same, and etching surfaces of the third insulating layer 416 and the lower wiring layer 417 may be the same. Here, the term "same etching surfaces" refers to the condition that since the pixel electrode 117, the lower conductive layer 317 or the lower wiring layer 417 operate as an etch mask while etching the third insulating layers 416 below the pixel electrode 117, the lower conductive layer 317 or the lower wiring layer 417, the etching surfaces thereof are approximately the same.

The insulating layer 16 may operate as a dielectric layer of the capacitor Cst by being directly disposed between the upper electrode 310 and the lower electrode 314 of the capacitor Cst, and not as a gate insulating layer, since the third insulating layer 16 is not disposed in the thin film transistor TFT. A material or a thickness of the insulating layer 16 may be selected by only considering the characteristics of the capacitor Cst without having to consider the characteristics of the thin film transistor TFT. Accordingly, the degree of freedom in designing processes may increase.

The insulating layer 16 may operate as the third insulating layer 416 between the first wire 414 and the second wire 410 that at least partially overlap with each other. Accordingly, the third insulating layer 416 may operate as a dielectric layer between the first and second wires 414 and 410, thereby decreasing parasitic capacitance. When the parasitic capacitance is decreased as such, an RC delay is improved, and thus a driving margin of the organic light-emitting display device 1 is obtained. Here, an insulating layer may be further disposed between the first and second wires 414 and 410. Accordingly, an electric short between the first and second wires 414 and 410 may be prevented. The organic light-emitting display device 1 may be manufactured to have a high reliability.

Figure 8:
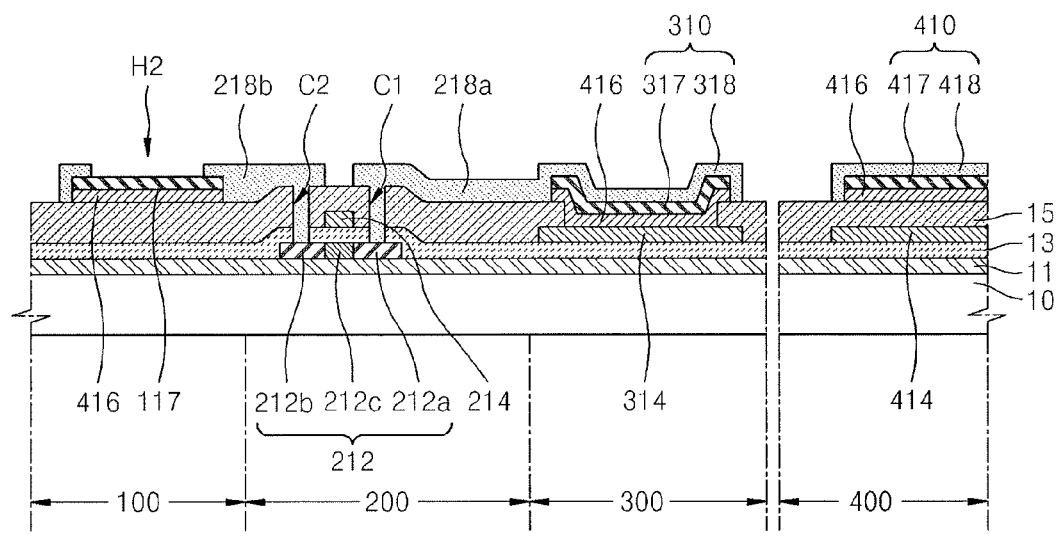
FIG. 8 is a cross-sectional view for describing a fifth mask process of the organic light-emitting display device of FIG. 1.

Then, as shown in FIG. 8, the source and drain electrodes 218a and 218b of the thin film transistor TFT, the upper conductive layer 318 of the upper electrode 310, and the upper wiring layer 418 of the second wire 410 may be formed.

In detail, a third conductive layer (not shown) may be formed on an entire surface of the substrate 10 so as to cover the resultant structure of FIG. 7. The source and drain electrodes 218a and 218b, the upper conductive layer 318 of the upper electrode 310, and the upper wiring layer 418 of the second wire 410 may be formed by patterning the third conductive layer via a mask process using a fifth mask (not shown).

The third conductive layer may be formed of a low resistance conductive material. For example, the third conductive layer may include a single or multilayer structure formed of at least one material selected from Al, Pt, Pd, Ag, Mg, Au, Ni, Nd, Ir, Cr, Li, Ca, Mo, Ti, W, Cu. The third conductive layer may be thick enough to fill the contact holes C1 and C2 exposing the source and drain regions 212a and 212b.

The third conductive layer may be patterned into the source and drain electrodes 218a and 218b that are connected to the source and drain regions 212a and 212b of the active layer 212 through the contact holes C1 and C2 via the mask process using the fifth mask. One of the source and drain electrodes 218a and 218b may be electrically connected to the pixel electrode 117. In the current embodiment, since the source and drain electrodes 218a and 218b may be formed after forming the pixel electrode 117, a connector of the source or drain electrode 218a or 218b connected to the pixel electrode 117 may be formed above the pixel electrode 117. Also, the third conductive layer may be patterned into the upper conductive layer 318 of the storage region 300 and the upper wiring layer 418 of the wiring region 400.

The pixel electrode 117, the lower conductive layer 317, and the lower wiring layer 417 formed from the second conductive layer 17 may also be exposed to an etchant while etching the third conductive layer. Accordingly, the third conductive layer may be formed of a material having a different etch rate from the second conductive layer 17 so as to prevent damage to the second conductive layer 17. The source and drain electrodes 218a and 218b, the upper conductive layer 318, and the upper wiring layer 418 may include a material having a different etch rate from the pixel electrode 117, the lower conductive layer 317, and the lower wiring layer 417.

Figure 9:
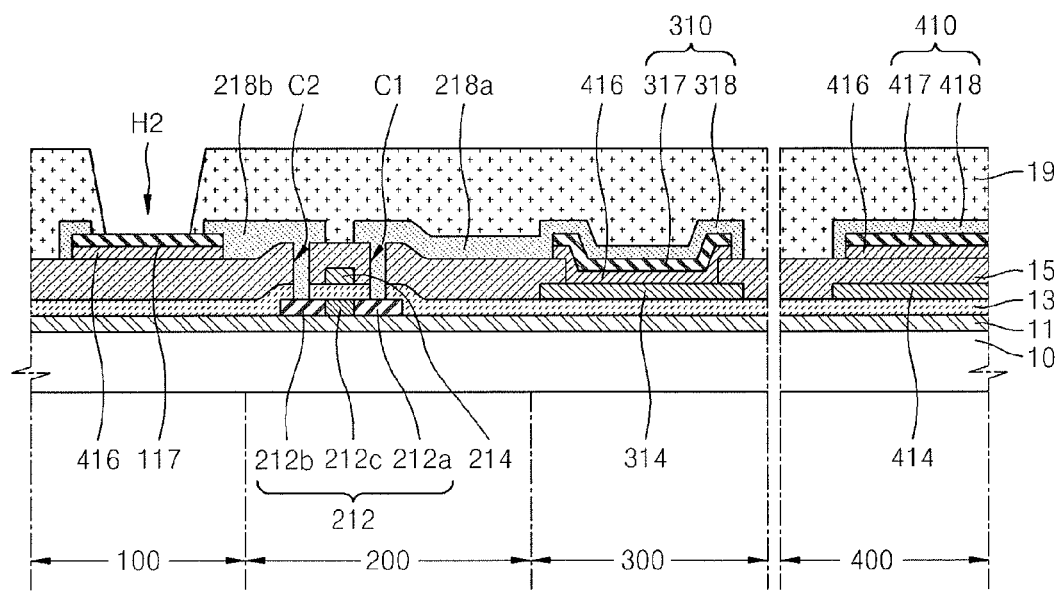
FIG. 9 is a cross-sectional view for describing a sixth mask process of the organic light-emitting display device of FIG. 1.

Next, as shown in FIG. 9, a fourth insulating layer 19 may be formed as a pixel-defining layer that partially exposes the pixel electrode 117.

In detail, the fourth insulating layer 19 may be formed on the entire surface of the substrate 10 on which the resultant structure of FIG. 8 is formed, and then a second opening H2 may be formed in the fourth insulating layer 19 to expose a center of the pixel electrode 117 by patterning the fourth insulating layer 19 via a mask process using a sixth mask (not shown), thereby defining a pixel.

The fourth insulating layer 19 may include a general-purpose polymer, such as a polymethyl methacrylate (PMMA) or polystyrene (PS), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, or a blend thereof. In another implementation, the fourth insulating layer 19 may be formed of not only an organic insulating material described above, but also an insulating material. In still another implementation, the fourth insulating layer 19 may have a multilayer structure in which an organic insulating material and an inorganic insulating material are alternately stacked on each other.

The second opening H2 may be formed to expose the center of the pixel electrode 117. Aside from defining a light-emitting region, the second opening H2 may increase an interval between an edge of the pixel electrode 117 and the counter electrode 119, thereby preventing an electric field from concentrating at the edge of the pixel electrode 117. Accordingly, a short of the pixel electrode 117 and the counter electrode 119 may be prevented.

Then, as shown in FIG. 3, the intermediate layer 118 including an organic light-emitting layer may be formed on the pixel electrode 117 partly exposed by the second opening H2 after the mask process using the sixth mask.

The intermediate layer 118 may have a single or complex structure in which an emissive layer (EML) and at least one functional layer from among a hole transport layer (HTL), a hole injection layer (HIL), an electron transport layer (ETL), and an electron injection layer (EIL) are stacked on each other.

The EML may be formed of a low molecular weight organic material or a polymer organic material.

When the EML is formed of a low molecular weight organic material, the intermediate layer 118 may be formed by stacking an HTL and an HIL in a direction toward the pixel electrode 117 and stacking an ETL and an EIL in a direction toward the counter electrode 119 from the EML. Other various layers may be stacked as desired. Here, examples of the low molecular organic material include copper phthalocyanine (CuPc), N,N'-Di(naphthalene-1-yl)-N,N'-diphenyl-benzidine (NPB), and tris-8-hydroxyquinoline aluminum (Alq3).

Alternatively, when the EML is formed of a polymer organic material, the intermediate layer 118 may include an HTL in a direction toward the pixel electrode 117 from the EML. The HTL may be formed of poly-(3,4)-ethylene-dihydroxy thiophene (PEDOT) or polyaniline (PANI).

The counter electrode 119 constituting a common electrode may be formed on the intermediate layer 118. According to the organic light-emitting display device 1 of the current embodiment, the pixel electrode 117 may be used as an anode and the counter electrode 119 may be used as a cathode, or vice versa.

When the organic light-emitting display device 1 is a bottom emission type display device, the counter electrode 119 may be a reflective electrode including a reflective material. The counter electrode 119 may be thick by including at least one material selected from Al, Mg, Li, Ca, LiF/Ca, and LiF/Al.

When the organic light-emitting display device 1 is a top emission type display device, the counter electrode 119 may be thin and may include at least one material selected from Al, Mg, Li, Ca, LiF/Ca, and LiF/Al. Here, the thickness of the counter electrode 119 may be from about 100 Å to about 300 Å to have a high transmittance.

Although not shown in FIG. 3, the organic light-emitting display device 1 according to the current embodiment may further include an encapsulation member (not shown) for encapsulating a display region including parts of the light-emitting region 100, the thin film transistor region 200, the storage region 300, and the wiring region 400. The encapsulation member may be a substrate including a glass material, a metal film, or an encapsulation thin film formed by alternately stacking an organic insulating layer and an inorganic insulating layer.

Figure 10A:
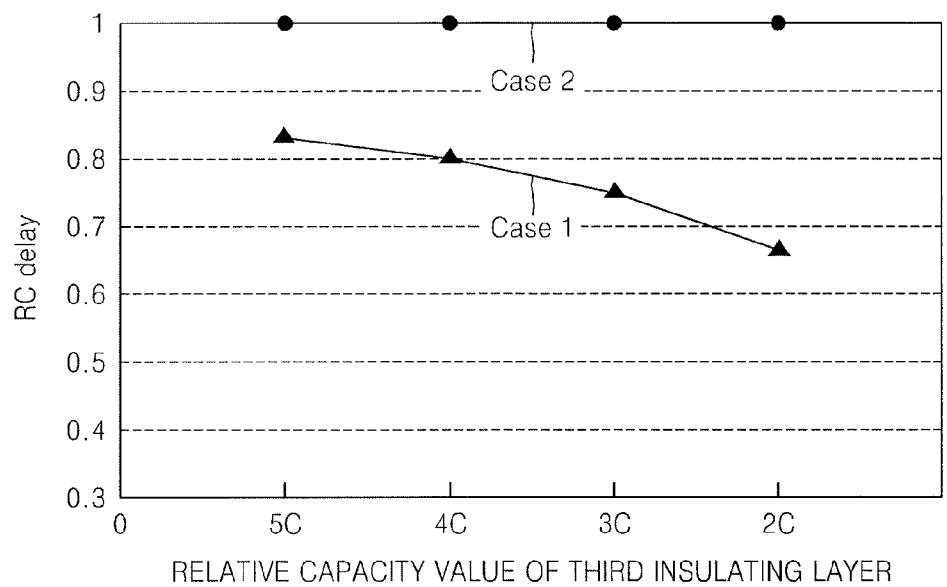
FIGS. 10A and 10B are graphs showing that resistance and capacitance (RC) delay of a wiring region of the organic light-emitting display device of FIG. 1 is improved compared to that of a conventional organic light-emitting display device.
Figure 10B:
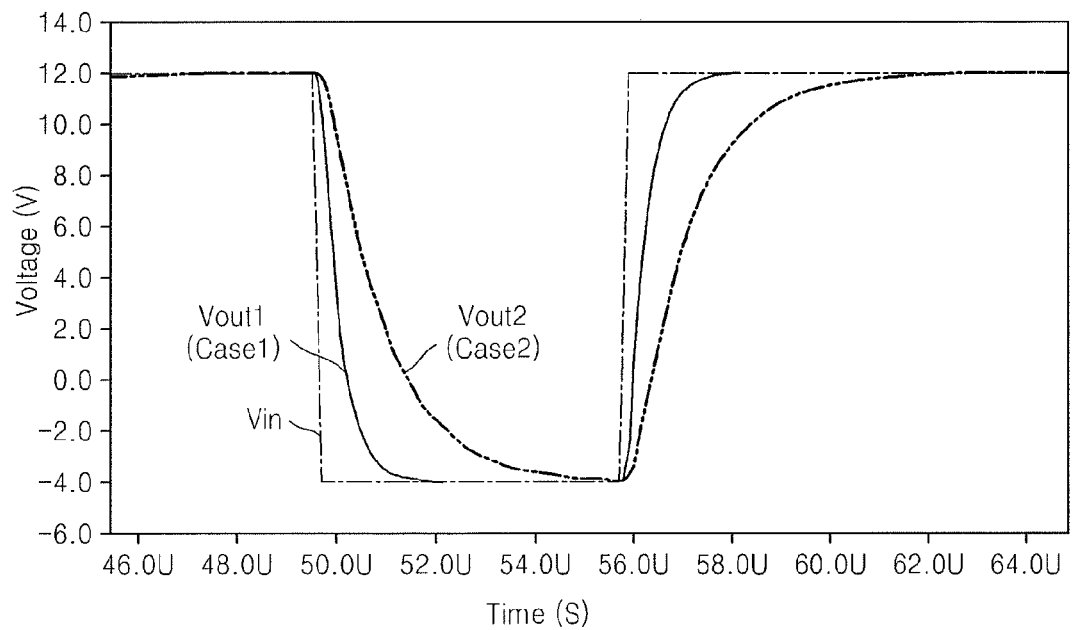

FIGS. 10A and 10B are graphs showing that the RC delay of the wiring region 400 of the organic light-emitting display device 1 of FIG. 1 is improved compared to that of a conventional organic light-emitting display device.

Referring to FIGS. 10A and 10B, Case 1 shows an RC delay of the wiring region 400 of the organic light-emitting display device 1 and Case 2 shows an RC delay of the conventional organic light-emitting display device that does not include a wire insulating film of a wiring region.

As shown in FIG. 10A, the RC delay in Case 1 is lower than the RC delay in Case 2. Looking at the waveforms of output signals with respect to input signals in FIG. 10B, the RC delay in Case 2 is higher than the RC delay in Case 1, and thus distortion of the output signal is high. In other words, the RC delay in Case 1 is improved compared to the RC delay in Case 2.

The organic light-emitting display device 1 is described as an example, but the subject matter described herein may be applied to other display devices including a liquid crystal display device.

Also, one thin film transistor and one capacitor are illustrated in the drawings, but the drawings are only for convenience of description and the described subject matter may include a plurality of thin film transistors and a plurality of capacitors. It is desirable that the number of mask processes not be increased.

By way of summation and review, according to a typical photolithography process, a photoresist is uniformly coated on a substrate on which a pattern is to be formed, the photoresist is exposed to light by using a light exposure device such as a stepper, and if the photoresist is a positive photoresist, the exposed photoresist is developed. After developing the photoresist, the pattern on the substrate is etched by using the remaining photoresist and unnecessary photoresist is removed In such a process where a pattern is transferred by using a mask, a mask including a desired pattern is typically prepared first, and thus a manufacturing cost for preparing the mask is increased when the number of processes using the mask is increased. Further, manufacturing processes are complex, since the above complex processes are performed, and thus, a manufacturing time and manufacturing cost are increased. Accordingly, it is desirable to manufacture the flat panel display device by reducing the number of processes of transferring a pattern by using a mask.

Moreover, wires disposed on different layers may overlap with each other in a predetermined region. Parasitic capacitance may be formed by upper and lower wires in such a predetermined region, and thus a short may be generated between the upper and lower wires, thereby generating a defect in the flat panel display device According to at least one embodiment, the organic light-emitting display device 1 may be manufactured via six mask processes, and an insulating layer may be additionally disposed between a lower wire and an upper wire in a wiring region. Accordingly, parasitic capacitance due to the upper and lower wires may be reduced, an RC delay of a panel may be reduced, and a short between the upper and lower wires may be prevented. Accordingly, embodiments disclosed herein may provide an organic light-emitting display device having simple manufacturing processes and excellent signal transmission, and a method of manufacturing the same. Moreover, embodiments disclosed herein may provide an organic light-emitting display device in which parasitic capacitance is reduced in a wiring region, and a method of manufacturing the same.

While embodiments have been particularly shown and described with reference to exemplary embodiments thereof, it will be understood by those of ordinary skill in the art that various changes in form and details may be made therein without departing from the spirit and scope as defined by the following claims.

What is claimed is:

1. An organic light-emitting display device, comprising:
a thin film transistor disposed on a substrate and including an active layer, a gate electrode, source and drain electrodes, a first insulating layer interposed between the active layer and the gate electrode, and a second insulating layer interposed between the source and drain electrodes, and the gate electrode;
a pixel electrode disposed on the second insulating layer;
a first wire disposed on the first insulating layer and formed of a same material as the gate electrode;
a second wire disposed on the second insulating layer to at least partially overlap with the first wire, the second wire including a lower wiring layer formed of a same material as the pixel electrode and an upper wiring layer disposed on the lower wiring layer and formed of a same material as the source and drain electrodes;
third insulating layers disposed between the second insulating layer and the pixel electrode and between the second insulating layer and the second wire;
a fourth insulating layer covering the source and drain electrodes and the upper electrode, and exposing the pixel electrode;
an intermediate layer disposed on the pixel electrode and including an organic light-emitting layer; and
a counter electrode disposed on the intermediate layer.

2. The organic light-emitting display device of claim 1, wherein the first insulating layer is commonly disposed on the active layer and below the first wire.

3. The organic light-emitting display device of claim 1, wherein the pixel electrode and the third insulating layer have a same etching surface.

4. The organic light-emitting display device of claim 1, wherein the second wire and the third insulating layer have a same etching surface.

5. The organic light-emitting display device of claim 1, wherein the third insulating layer includes at least one of $SiN_x$, $SiO_2$, $ZrO_2$, $TiO_2$, $Ta_2O_5$, and $Al_2O_3$.

6. The organic light-emitting display device of claim 1, wherein the third insulating layer includes a material having a different etch rate from the second insulating layer.

7. The organic light-emitting display device of claim 1, wherein the material of the source electrode, the drain electrode, and the upper wiring layer has a different etch rate from the pixel electrode and the lower wiring layer.

8. The organic light-emitting display device of claim 1, wherein the pixel electrode is electrically connected to one of the source and drain electrodes through one connector disposed above the pixel electrode.

9. The organic light-emitting display device of claim 1, further comprising a capacitor that includes: a lower electrode disposed on the same layer as the gate electrode; and an upper electrode including a lower conductive layer formed of the same material as the pixel electrode and an upper conductive layer disposed on the lower conductive layer and formed of the same material as the source and drain electrodes,
wherein the third insulating layer is also directly disposed between the lower electrode and the upper electrode.

10. The organic light-emitting display device of claim 9, wherein the first insulating layer is commonly disposed on the active layer and below the lower electrode.

11. The organic light-emitting display device of claim 9, wherein the second insulating layer is not disposed between the upper electrode and the lower electrode.

12. The organic light-emitting display device of claim 9, wherein the upper electrode and the third insulating layer have a same etching surface.

13. The organic light-emitting display device of claim 9, wherein a thickness of the third insulating layer is less than a thickness of the second insulating layer.

14. The organic light-emitting display device of claim 9, wherein a dielectric constant of the third insulating layer is higher than a dielectric constant of the first insulating layer.

15. The organic light-emitting display device of claim 1, wherein the first wire is a scan wire electrically connected to the gate electrode, and the second wire is a data wire electrically connected to one of the source and drain electrodes.

16. The organic light-emitting display device of claim 9, wherein the first wire is a power supply wire electrically connected to the lower electrode, and the second wire is a data wire electrically connected to one of the source and drain electrodes.

17. The organic light-emitting display device of claim 9, wherein the first wire is a scan wire electrically connected to the gate electrode, and the second wire is a power supply wire electrically connected to the upper electrode.

18. The organic light-emitting display device of claim 1, wherein the pixel electrode is a light transmission electrode and the counter electrode is a light reflection electrode.

19. The organic light-emitting display device of claim 18, wherein the pixel electrode and a lower wiring layer of the second wire include a transparent conducting oxide (TCO), wherein the TCO includes at least one of indium tin oxide (ITO), indium zinc oxide (IZO), zinc oxide (ZnO), indium oxide ($In_2O_3$), indium gallium oxide (IGO), and aluminum zinc oxide (AZO).

20. The organic light-emitting display device of claim 1, wherein the pixel electrode is a light reflection electrode and the counter electrode is a light transmission electrode.

21. The organic light-emitting display device of claim 20, wherein the pixel electrode and a lower wiring layer of the second wire include a semi-transmission metal layer and a transparent conducting oxide (TCO), wherein the semi-transmission metal layer includes at least one of silver (Ag), aluminum (Al), and an alloy thereof.

22. A method of manufacturing an organic light-emitting display device, the method comprising:
    performing a first mask process by forming a semiconductor layer on a substrate and forming an active layer of a thin film transistor (TFT) by patterning the semiconductor layer;
    performing a second mask process by forming a first insulating layer, stacking a first conductive layer on the first insulating layer, and forming a first wire and a gate electrode of the TFT by patterning the first conductive layer;
    performing a third mask process by forming a second insulating layer and holes in the second insulating layer to partially expose source and drain regions of the active layer and forming an upper electrode;
    performing a fourth mask process by sequentially forming an insulating layer and a second conductive layer on a resultant structure of the third mask process, and forming a third insulating layer, and a pixel electrode and a lower wiring layer of a second wire at least partially overlapping with the first wire by simultaneously patterning the insulating layer and the second conductive layer;
    performing a fifth mask process by forming a third conductive layer on a resultant structure of the fourth mask process, and forming a source electrode, a drain electrode, and an upper wiring layer of the second wire by patterning the third conductive layer;
    performing a sixth mask process by forming a fourth insulating layer and removing at least a part of the fourth insulating layer to partially expose the pixel electrode; and
    forming an intermediate layer including an organic light-emitting layer on the exposed pixel electrode, and forming a counter electrode facing the pixel electrode to cover the intermediate layer.

23. The method of claim 22, further comprising, after the performing of the second mask process, doping the source and drain regions with an ion impurity.

24. The method of claim 22, wherein the performing of the fourth mask process includes:
    etching the third insulating layer; and
    etching the second conductive layer.

25. The method of claim 22, wherein the third insulating layer includes a material having a different etch rate from the second insulating layer.

26. The method of claim 22, wherein the performing of the fifth mask process includes forming the third conductive layer with a material having a different etch rate from the second conductive layer.

27. The method of claim 22, wherein the performing of the second mask process includes also forming a lower electrode of a capacitor by patterning the first conductive layer,
    the performing of the fourth mask process includes forming a dielectric layer directly disposed on the lower electrode and a lower conductive layer of the upper electrode by simultaneously patterning the insulating layer and the second conductive layer, and
    the performing of the fifth mask process includes forming an upper conductive layer of the upper electrode by patterning the third conductive layer.

* * * * *